United States Patent
Forbes

(10) Patent No.: US 7,202,530 B2
(45) Date of Patent: Apr. 10, 2007

(54) MICRO-MECHANICALLY STRAINED SEMICONDUCTOR FILM

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/210,927

(22) Filed: Aug. 24, 2005

(65) Prior Publication Data

US 2006/0011982 A1 Jan. 19, 2006

Related U.S. Application Data

(62) Division of application No. 10/379,749, filed on Mar. 5, 2003.

(51) Int. Cl.
*H01L 27/01* (2006.01)
(52) U.S. Cl. .................................. 257/347; 257/401
(58) Field of Classification Search ............. 257/347, 257/401, 506, 618
See application file for complete search history.

(56) References Cited

U.S. PATENT DOCUMENTS

| | | |
|---|---|---|
| 5,234,535 A | 8/1993 | Beyer et al. |
| 5,441,591 A | 8/1995 | Imthurn et al. |
| 5,461,243 A | 10/1995 | Ek et al. |
| 5,673,223 A | 9/1997 | Park |
| 5,691,230 A | 11/1997 | Forbes |
| 5,759,898 A | 6/1998 | Ek et al. |
| 5,854,501 A | 12/1998 | Kao |
| 5,877,070 A | 3/1999 | Goesele et al. |
| 5,879,996 A | 3/1999 | Forbes |
| 5,949,102 A | 9/1999 | Saida et al. |
| 5,963,817 A | 10/1999 | Chu et al. |
| 6,022,793 A | 2/2000 | Wijaranakula et al. |
| 6,093,623 A | 7/2000 | Forbes |
| 6,096,433 A | 8/2000 | Kikuchi et al. |
| 6,103,598 A | 8/2000 | Yamagata et al. |
| 6,110,793 A | 8/2000 | Lee et al. |
| 6,136,666 A | 10/2000 | So |

(Continued)

FOREIGN PATENT DOCUMENTS

| | | |
|---|---|---|
| JP | 54-152464 A | 11/1979 |
| JP | 54-155770 A | 12/1979 |
| JP | 2001-093887 | 4/2001 |

OTHER PUBLICATIONS

"Cornell Demonstrates a Universal Substrate", *Compound Semiconductor*, 3(2), (Mar./Apr. 1997), 27-29.

(Continued)

*Primary Examiner*—Mark V. Prenty
(74) *Attorney, Agent, or Firm*—Schwegman, Lundberg, Woessner & Kluth, P.A.

(57) ABSTRACT

One aspect of the present subject matter relates to a method for forming strained semiconductor film. In various embodiments, a single crystalline semiconductor film is formed on a substrate surface, and a recess is created beneath the film. A portion of the film is influenced into the void and strained. In various embodiments, the naturally-occurring Van der Waal's force is sufficient to influence the film into the void. In various embodiments, a nano-imprint mask is used to assist with influencing the film into the void. In various embodiments, an oxide region is formed in a silicon substrate, and a single crystalline silicon film is formed on the semiconductor substrate and on at least a portion of the oxide region. The oxide region is removed allowing the Van der Waal's force to bond the film to the silicon substrate. Other aspects are provided herein.

38 Claims, 10 Drawing Sheets

U.S. PATENT DOCUMENTS

| | | | |
|---|---|---|---|
| 6,143,628 A | 11/2000 | Sato et al. | |
| 6,162,657 A | 12/2000 | Schiele et al. | |
| 6,180,487 B1 | 1/2001 | Lin | |
| 6,228,694 B1 | 5/2001 | Doyle et al. | |
| 6,251,751 B1 | 6/2001 | Chu et al. | |
| 6,261,876 B1 | 7/2001 | Crowder et al. | |
| 6,274,457 B1 | 8/2001 | Sakai et al. | |
| 6,274,460 B1 | 8/2001 | Delgado et al. | |
| 6,309,950 B1 | 10/2001 | Forbes | |
| 6,328,796 B1 | 12/2001 | Kub et al. | |
| 6,377,070 B1 | 4/2002 | Forbes | |
| 6,423,613 B1 | 7/2002 | Geusic | |
| 6,424,001 B1 | 7/2002 | Forbes et al. | |
| 6,448,157 B1 | 9/2002 | Okonogi | |
| 6,448,601 B1 | 9/2002 | Forbes et al. | |
| 6,451,672 B1 | 9/2002 | Caruso et al. | |
| 6,455,397 B1 | 9/2002 | Belford | |
| 6,461,933 B2 | 10/2002 | Houston | |
| 6,476,434 B1 | 11/2002 | Noble et al. | |
| 6,478,883 B1 | 11/2002 | Tamatsuka et al. | |
| 6,486,008 B1 | 11/2002 | Lee | |
| 6,496,034 B2 | 12/2002 | Forbes et al. | |
| 6,497,763 B2 | 12/2002 | Kub et al. | |
| 6,514,836 B2 | 2/2003 | Belford | |
| 6,515,335 B1 | 2/2003 | Christiansen et al. | |
| 6,531,727 B2 | 3/2003 | Forbes et al. | |
| 6,541,356 B2 | 4/2003 | Fogel et al. | |
| 6,559,491 B2 | 5/2003 | Forbes et al. | |
| 6,566,682 B2 | 5/2003 | Forbes | |
| 6,583,052 B2 | 6/2003 | Shin | |
| 6,583,437 B2 | 6/2003 | Mizuno et al. | |
| 6,593,625 B2 | 7/2003 | Christiansen et al. | |
| 6,597,203 B2 | 7/2003 | Forbes | |
| 6,620,683 B1 | 9/2003 | Lin et al. | |
| 6,630,713 B2 | 10/2003 | Geusic | |
| 6,649,476 B2 | 11/2003 | Forbes | |
| 6,649,492 B2 | 11/2003 | Chu et al. | |
| 6,656,782 B2 | 12/2003 | Skotnicki et al. | |
| 6,656,822 B2 | 12/2003 | Doyle et al. | |
| 6,689,671 B1 | 2/2004 | Yu et al. | |
| 6,703,293 B2 | 3/2004 | Tweet et al. | |
| 6,703,648 B1 | 3/2004 | Xiang et al. | |
| 6,740,913 B2 | 5/2004 | Doyle et al. | |
| 6,812,508 B2 | 11/2004 | Fukumi | |
| 6,900,094 B2 | 5/2005 | Hammond et al. | |
| 6,902,616 B1 | 6/2005 | Yamazaki et al. | |
| 6,987,037 B2 | 1/2006 | Forbes | |
| 6,994,762 B2 | 2/2006 | Clingman et al. | |
| 7,008,854 B2 | 3/2006 | Forbes | |
| 7,023,051 B2 | 4/2006 | Forbes | |
| 7,041,575 B2 | 5/2006 | Forbes | |
| 7,045,874 B2 * | 5/2006 | Forbes | 257/510 |
| 7,084,429 B2 | 8/2006 | Forbes | |
| 7,115,480 B2 | 10/2006 | Forbes | |
| 2002/0001965 A1 | 1/2002 | Forbes | |
| 2002/0135020 A1 | 9/2002 | Skotnicki et al. | |
| 2002/0163045 A1 | 11/2002 | Farrar | |
| 2002/0185686 A1 | 12/2002 | Christiansen et al. | |
| 2003/0013323 A1 | 1/2003 | Hammond et al. | |
| 2003/0201468 A1 | 10/2003 | Christiansen et al. | |
| 2003/0218189 A1 | 11/2003 | Christiansen et al. | |
| 2003/0227072 A1 | 12/2003 | Forbes | |
| 2004/0171196 A1 | 9/2004 | Walitzki | |
| 2004/0214366 A1 | 10/2004 | Segal et al. | |
| 2004/0217352 A1 | 11/2004 | Forbes | |
| 2004/0217391 A1 | 11/2004 | Forbes | |
| 2004/0224480 A1 | 11/2004 | Forbes | |
| 2004/0232422 A1 | 11/2004 | Forbes | |
| 2004/0232487 A1 | 11/2004 | Forbes | |
| 2004/0232488 A1 | 11/2004 | Forbes | |
| 2004/0235264 A1 | 11/2004 | Forbes | |
| 2005/0017273 A1 | 1/2005 | Forbes et al. | |
| 2005/0020094 A1 | 1/2005 | Forbes et al. | |
| 2005/0023529 A1 | 2/2005 | Forbes | |
| 2005/0023612 A1 | 2/2005 | Forbes | |
| 2005/0023616 A1 | 2/2005 | Forbes | |
| 2005/0029619 A1 | 2/2005 | Forbes | |
| 2005/0029683 A1 | 2/2005 | Forbes et al. | |
| 2005/0032296 A1 | 2/2005 | Forbes | |
| 2005/0250274 A1 | 11/2005 | Forbes et al. | |
| 2005/0285139 A1 | 12/2005 | Forbes | |
| 2006/0001094 A1 | 1/2006 | Forbes | |
| 2006/0097281 A1 | 5/2006 | Forbes | |
| 2006/0208343 A1 | 9/2006 | Forbes | |

OTHER PUBLICATIONS

Abe, T , "Silicon Wager-Bonding Process Technology for SOI Structures", *Extended Abstracts of the 22nd (1990 International) Conference on Solid State Devices and Materials*(1990), 853-856.

Auberton-Herve, A J., "SOI: Materials to Systems", *International Electron Devices Meeting. Technical Digest*, (1996), 3-10.

Auberton-Herve, A. J., "SOI: Materials to Systems", *Digest of the International Electron Device Meeting*, San Francisco,(Dec. 1996), 3-10.

Autumn, Kellar, et al., "Adhesive force of a single gecko foot-hair", *Nature*, 405(6787), (Jun. 2000), 681-685.

Autumn, Kellar , et al., "Evidence for van der Waals adhesion in gecko setae.", *Proceedings of the National Academy of Science U S A.*; 99(19), (Sep. 17, 2002), 12252-6.

Belford, Rona E., et al., "Performance-Augmented CMOS Using Back-End Uniaxial Strain", *IEEE 60th DRC. Conference Digest Device Research Conference*, 2002, (Jun. 24-26, 2002), 41-42.

Berti, M. , "Composition and Structure of Si-Ge Layers Produced by Ion Implantation and Laser Melting", *Journal of Materials Research*, 6(10), (Oct. 1991), 2120-2126.

Berti, M. , "Laser Induced Epitaxial Regrowth of Si[sub 1-x]Ge[sub x]/Si Layers Produced by Ge Ion Implantation", *Applied Surface Science*, 43, (1989), 158-164.

Biever, Celeste, "Secret of 'strained silicon' revealed: behind closed doors, Intel has perfected a novel way to improve chip performance. ", *New Scientist*, 180(i2426-2428), (Dec. 20, 2003), 27.

Brown, Chappell, "Bonding twist hints at universal substrate", *EETimes*, (1997), 2 pages.

Bruel, M, "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997), 1636-1641.

Chen, Xiangdong , et al., "Vertical P-MOSFETs with heterojunction between source/drain and channel", *IEEE Device Research Conference*, (2000), 25-26.

Chilton, B T., et al., "Solid phase epitaxial regrowth of strained Si(1-x)Ge(x)/Si strained layer structures amorphized by ion implantation", *Applied Physics Letters*, 54(1), (Jan. 2, 1989), 42-44.

Clark, Don , et al., "Intel unveils tiny new transistors: Process handles circuits 1/2000th the width of a human hair", *The Wall Street Journal*, (Aug. 13, 2002), 3 pages.

Clifton, P A., et al., "A process for strained silicon n-channel HMOSFETs", *ESSDERC'96. Proceedings of the 26th European Solid State Device Research Conference*, (Sep. 1996), 519-22.

Dharmatilleke, S N., et al., "Anodic Bonding of Glass to Glass and Silicon to Glass or Silicon to Silicon Through a Very Thick Thermally Grown SiO2 Layer", *Proceedings of IS 3M International Symposium on Smart Structures and Microsystems*, http://dolphin. eng.uc.edu/projects/bonding/paper.pdf, (2000), 32.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998), 13-17.

Fischetti M V., et al., "Band structure, deformation potentials, and carrier mobility in strained Si, Ge, and SiGe alloys", *Journal of Applied Physics*, 80(4), (Aug. 15, 1996), 2234-2252.

Fournel, F, et al., "Ultra High Precision Of The Tilt/Twist Misorientation Angles In Silicon/Silicon Direct Wafer Bonding", *Abstract—Electronic Materials Conference*, (Jun. 2002), 9.

Garcia, G A., et al., "High-quality CMOS in thin (100 nm) silicon on sapphire", *IEEE Electron Device Letters*, 9(1), (Jan. 1988), 32-34.

Harendt, Christine, "Silicon on Insulator Material by Wafer Bonding", *Journal of Electronic Materials*, 20(3), (Mar. 1991), 267-77.

Imthurn, George P., et al., "Bonded Silicon-on-Sapphire Wafers and Devices", *Journal of Applied Physics*, 72(6), (Sep. 1992), 2526-7.

Iyer, S S., "Separation by Plasma Implantation of Oxygen (SPIMOX) operational phase space", *IEEE trans. on Plasma Science*, 25, (1997), 1128-1135.

Jurczak, M , "SON (silicon on nothing)—a new device architecture for the ULSI era", *VLSI Technology, 1999. Digest of Technical Papers. 1999 Symposium on Jun. 14-16, 1999*, 29-30.

Kalavade, Pranav, et al., "A novel sub-10 nm transistor", *58th DRC. Device Research Conference. Conference Digest*, (Jun. 19-21, 2000), 71-72.

Kostrzewa, M, et al., "Testing the Feasibility of strain relaxed InAsP and InGaAs compiant substrates", *EMC 2003 International Conference Inium Phosphide and Related Materials. Conference Proceedings*, (Jun. 2003), 8.

Lasky, J. B., "Wafer Bonding for Silicon-on-Insulator Technologies", *Applied Physics Letters*, 48(1), (Jan. 6, 1986), 78-80.

Loo, Y L., et al., "Contact Printing With Nanometer Resolution", *Device Research Conference*, (Jun. 2002), 149-150.

Lu, D, , "Bonding Silicon Wafers by Use of Electrostatic Fields Followed by Rapid Thermal Heating", *Materials Letters*, 4(11), (Oct. 1986), 461-464.

Lu, X. , et al., "SiGe and SiGeC Surface Alloy Formation Using High-Dose Implantation and Solid Phase Epitaxy", *Proceedings of the 11th International Conference on Ion Implantation Technology*, Austin, TX, (1997), 686-689.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers*, (2000), 210-211.

Moran, Peter, "Strain Relaxation in Wafer-Bonded SiGe/Si Heterostructures Due to Viscous Flow of an Underlying Borosilicate Glass", *Electronic Materials Conference, Santa Barbara, Jun. 2002*, Abstract, pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),2 8-32.

Nayak, D.K., "High performance GeSi quantum-well PMOS on SIMOX", *International Electron Devices Meeting 1992. Technical Digest*, (1992), 777-80.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo, et al., "Semiconductor Surface with Strain Control", http://www.brl.ntt.co.jp/J/kouhou/katsudou/report00/E/report04_e.html.

Ouyang, Q, et al., "Bandgap Engineering in Deep Submicron Vertical pMOSFETs", *IEEE 58th DRC. Device Research Conference. Conference Digest*, (2000), 27-28.

Paine, D. C., et al., "The Growth of Strained Si]-xGex Alloys on (100) Silicon Using Solid Phase Epitaxy", *Journal of Materials Research*, 5(5), (May 1990), 1023-1031.

People, R., "Calculation of critical layer thickness versus lattice mismatch for GexSi1-x/Si strained-layer heterostructures", *Applied Physics Letters*, 47(3), (Aug. 1, 1985), 322-4.

Rim, Kern , et al., "Fabrication and analysis of deep submicron strained-Si n-MOSFET's", *IEEE Transactions on Electron Devices*, 47(7), (Jul. 2000), 1406-1415.

Rim, Kern , et al., "Strained Si NMOSFETs for High Performance CMOS Technology", *2001 Symposium on VLSI Technology. Digest of Technical Papers*, (2001), 59-60.

Rim, Kern , et al., "Transconductance enhancement in deep submicron strained Si n-MOSFETs", *International Electron Devices Meeting 1998. Technical Digest*, (1998), 707-710.

Sugiyama, N , et al., "Formation of strained-silicon layer on thin relaxed-SiGe/SiO/sub 2//Si structure using SIMOX technology", *Thin Solid Films*, 369(1-2), (Jul. 2000), 199-202.

Takagi, Shin-Ichi, "Strained-Si- and SiGe-On-Insulator (Strained-SOI and SGOI) MOSFETs for High Performance/Low Power CMOS Application", *IEEE Digest Research Conference, 2002. 60th DRC. Conference Digest*, (2002), 37-40.

Verdonckt-Vandebroek,, Sophie, et al., "SiGe—Channel Heterojunction p-MOSFET's", *IEEE Transactions on Electron Devices*, 41(1), (Jan. 1994), 90-101.

Welser, J , et al., "Strain dependence of the performance enhancement in strained-Si n-MOSFETs", *IEEE International Electron Devices Meeting 1994. Technical Digest*, (Dec. 11-14, 1994), 373-376.

Wild, M. , "Laser Assisted Bonding of Silicon and Glass in Micro-System Technology", http://www.ilt.fhg.de/eng/jb00-s42.html, Fraunhofer ILT—jb00-s42, (2003), 1.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000), 67-68.

Yin, Haizhou, "High Ge-Content Relaxed Si1-xGex Layers by Relaxation on Complaint Substrate with Controlled Oxidation", *Electron Materials Conference, Santa Barbara*, Jun. 2002, 8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996), 31.

Zhu, Z H., et al., "Wafer bonding technology and its applications in optoelectronic and materials", *IEEE Journal of Selected Topics in Quantum Electronics*, (Jun. 1997), 927-936.

Forbes, K Y., "Non-Volatile Memory Devie with Tensile Strained Silicon Layer", *U.S. Appl. No. 11/260,339*, 26 pgs., Oct. 27, 2005.

* cited by examiner

MICRO-MECHANICALLY STRAINED SEMICONDUCTOR FILM

CROSS REFERENCE TO RELATED APPLICATIONS

The present application is a divisional of U.S. application Ser. No. 10/379,749, filed on Mar. 5, 2003, which is herein incorporated by reference in its entirety.

This application is related to the following commonly assigned U.S. patent applications which are herein incorporated by reference in their entirety: "Output Prediction Logic Circuits With Ultra-Thin Vertical Transistors and Methods of Formation," U.S. application Ser. No. 10/164,611, filed on Jun. 10, 2002; "Localized Ultra-Thin Strained Silicon On Insulator," U.S. application Ser. No. 10/425,797, filed on Apr. 29, 2003; "Strained Si/SiGe Layer Structures By Ion Implantation," U.S. application Ser. No. 10/431,134, filed on May 7, 2003; and "Strained Silicon By A Twist/Tilt Misorientation In Wafer Bonding," U.S. application Ser. No. 10/425,484, filed on Apr. 29, 2003.

TECHNICAL FIELD

This disclosure relates generally to semiconductor devices, and more particularly, to devices formed with strained semiconductor films.

BACKGROUND

The semiconductor industry continues to strive for improvements in the speed and performance of semiconductor devices. Strained silicon technology has been shown to enhance carrier mobility in both n and p-channel devices, and thus has been of interest to the semiconductor industry as a means to improve device speed and performance.

One technique for producing strained silicon involves growing silicon (Si) layers on relaxed silicon-germanium (Si—Ge) layers. There is a large mismatch in the cell structure between the Si and Si—Ge layers. This mismatch causes a pseudo-morphic layer of Si on relaxed SiGe to be under biaxial tensile strain. The biaxial strain modifies the band structure and enhances carrier transport in the Si layer. In an electron inversion layer, the subband splitting is larger in strained Si because of the strain-induced band splitting in addition to that provided by quantum confinement. For example, the ground level splitting $(E_0(d_4)-E_0(d_2))$ in a MOS inversion layer at 1 MV/cm transverse field is ~120 meV for unstrained Si and ~250 meV for strained Si. The increase in energy splitting reduces inter-valley scattering and enhances NMOSFET mobility, as demonstrated at low (<0.6 MV/cm) and higher (~1 MV/cm) vertical fields. The scaled transconductance (gm) is also improved due to the reduced density of states and enhanced non-equilibrium transport.

Si has a lattice constant of 5.43095 Å, and Ge has a lattice constant of 5.64613 Å. The lattice constant of SiGe is between the lattice constant of Si and the lattice constant of Ge, and depends on the percentage of Ge in the SiGe layer.

FIG. 1 illustrates the lattice constant of a $Si_{1-X}Ge_X$ substrate for different percentages (X) of Ge. As indicated by FIG. 1, a $Si_{1-X}Ge_X$ substrate containing about 30% Ge (X≈0.3) has a lattice constant of about 5.50 Å. The biaxial strain of the Si on the SiGe can be calculated as follows:

$$\text{Biaxial\_Strain} = \frac{SiGe_{LC} - Si_{LC}}{Si_{LC}}, \quad (1)$$

where the subscript LC represents the lattice constant of the SiGe or Si. Thus, as shown in Equation 2, the Si on the SiGe substrate has a biaxial strain of about 1.28%.

$$\text{Biaxial\_Strain} \approx \frac{5.50 - 5.43}{5.43} = 1.28\% \quad (2)$$

FIG. 2 illustrates the mobility enhancement for strained Si for different percentages (X) of Ge in a $Si_{1-X}Ge_X$ substrate. The mobility enhancement increases as the percentage of Ge in the $Si_{1-X}Ge_X$ increases, and levels off to around 1.6 when the percentage of Ge is around 22% or larger. Referring to FIG. 1, 22% Ge provides the $Si_{1-X}Ge_X$ substrate with a lattice constant $(SiGe_{LC})$ of around 5.485. Using Equation 1, it is determined that the corresponding strain for 22% Ge (the approximate point where the mobility enhancement levels off) is about 1%.

Referring again to FIG. 2, it can be seen that a $Si_{1-X}Ge_X$ substrate having just under 10% Ge still provides considerable mobility enhancement (1.3). A $Si_{1-X}Ge_X$ substrate having just under 10% Ge provides the $Si_{1-X}Ge_X$ substrate with a lattice constant $(SiGe_{LC})$ of around 5.457. Using Equation 1, it is determined that the corresponding strain is around 0.5%. Thus, it is desirable to achieve a biaxial strain around or greater than 0.5%, and preferably around 1% or greater to obtain the desired enhanced mobility associated with strained Si.

One method for forming the strained Si layer on the relaxed SiGe layer involves epitaxially growing the Si and SiGe layers using an ultra-high vacuum chemical vapor deposition (UHVCVD) process. The UHVCVD process which is a costly and complex process. The Ge content is graded in steps to form a fully relaxed SiGe buffer layer before a thin (~20 nm) strained Si channel layer is grown. X-ray diffraction analysis can be used to quantify the Ge content and strain relaxation in the SiGe layer. The strain state of the Si channel layer can be confirmed by Raman spectroscopy.

A proposed back end approach for straining silicon applies uniaxial strain to wafers/dies after the integrated circuit process is complete. The dies are thinned to membrane dimensions and then affixed to curved substrates to apply an in-plane, tensile strain after device manufacture.

Research has found that uniaxial strained silicon has advantages over biaxial strained silicon. Less strain is required to obtain an improvement factor if the silicon is strained uniaxially rather than biaxially. Uniaxial strained silicon reduces band gap and in-plane effective mass to improve conduction. Additionally, the work function is altered and contact potentials are reduced.

There is a need in the art to provide improved strained semiconductor films and devices that incorporate the strained films, and to provide improved methods for forming strained semiconductor films.

SUMMARY

The above mentioned problems are addressed by the present subject matter and will be understood by reading and studying the following specification. The present subject matter relates to strained semiconductor films along with the structures and devices that include strained semiconductor films. The present subject matter further relates to methods of forming the strained semiconductor films along with methods of forming structures and devices that include strained semiconductor films.

The present subject provides uniaxially-strained semiconductor films, which has been shown to possess advantages over biaxially strained films. The strained films are produced using semiconductor processes that are simple and low cost. Strained semiconductor layers are provided by forming dimpled semiconductor layers using a micro-mechanical technique. The micro-mechanical technique uses the strong Van der Waal's force that naturally bond surfaces together as the bonding force between a substrate with recesses and the semiconductor layer. The semiconductor layers dimple as they are drawn into the recesses and bonded to the substrate. In various embodiments, an imprint mask is used to provide the dimpling force, in addition to the Van der Waal's force. The strained semiconductor material enhances electron mobility, and is also capable of enhancing hole mobility.

One aspect of the present subject matter relates to a method for forming strained semiconductor film. In various embodiments of the method, a single crystalline semiconductor film is formed on a substrate surface, and a recess is created beneath the film such that a portion of the film is influenced into the recess to strain the film. In various embodiments, the naturally-occurring Van der Waal's force is sufficient to influence the film into the recess. In various embodiments, a nano-imprint mask is used to assist with influencing the film into the recess.

In various embodiments of the method, an oxide region is formed in a silicon substrate using a LOCal Oxidation of Silicon (LOCOS) process. A single crystalline silicon film is formed on the semiconductor substrate and on at least a portion of the oxide region. The oxide region is removed from underneath the film such that a Van der Waal's force acts to draw a portion of the film into the void and bond the film to the silicon substrate.

One aspect of the present subject matter relates to a semiconductor structure. In various embodiments, the structure includes a substrate with a number of recesses and a single crystalline semiconductor film bonded to the substrate within the number of recesses, which micro-mechanically strains the semiconductor film. The structure further includes a gate formed over the semiconductor film over at least a portion of each of the number of recesses. The gate is separated from the semiconductor film by a gate insulator. The semiconductor film formed over at least a portion of each of the number of recesses includes a channel region having a length less than 1000 Å and a depth less than about 300 Å. Thus, an ultra-thin body is capable of being formed in the semiconductor film.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in sidewall), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In various embodiments, the present subject matter micromechanically strains ultra-thin transistor body layers using the naturally-occurring Van der Waal's force. The term micro-mechanical refers to the quantitative relations of force and matter at a very small or microscopic level. An ultra-thin body relates to transistor bodies having a length of about 100 nm (1000 Å) or less, and a thickness of about 30 nm (300 Å) or less. Once strained, the ultra-thin body layer is bonded to the substrate by Van der Waal's force, which is the natural force that holds together bonded wafers. The present subject matter uses well-known, low cost semiconductor processing techniques, and takes advantage of the naturally-occurring Van der Waal's force to mechanically flex or bend the semiconductor film to obtain a desired strain in the film. The resulting strain is sufficient to desirably modify the band structure and electron mobility of the semiconductor material.

Figure 1:
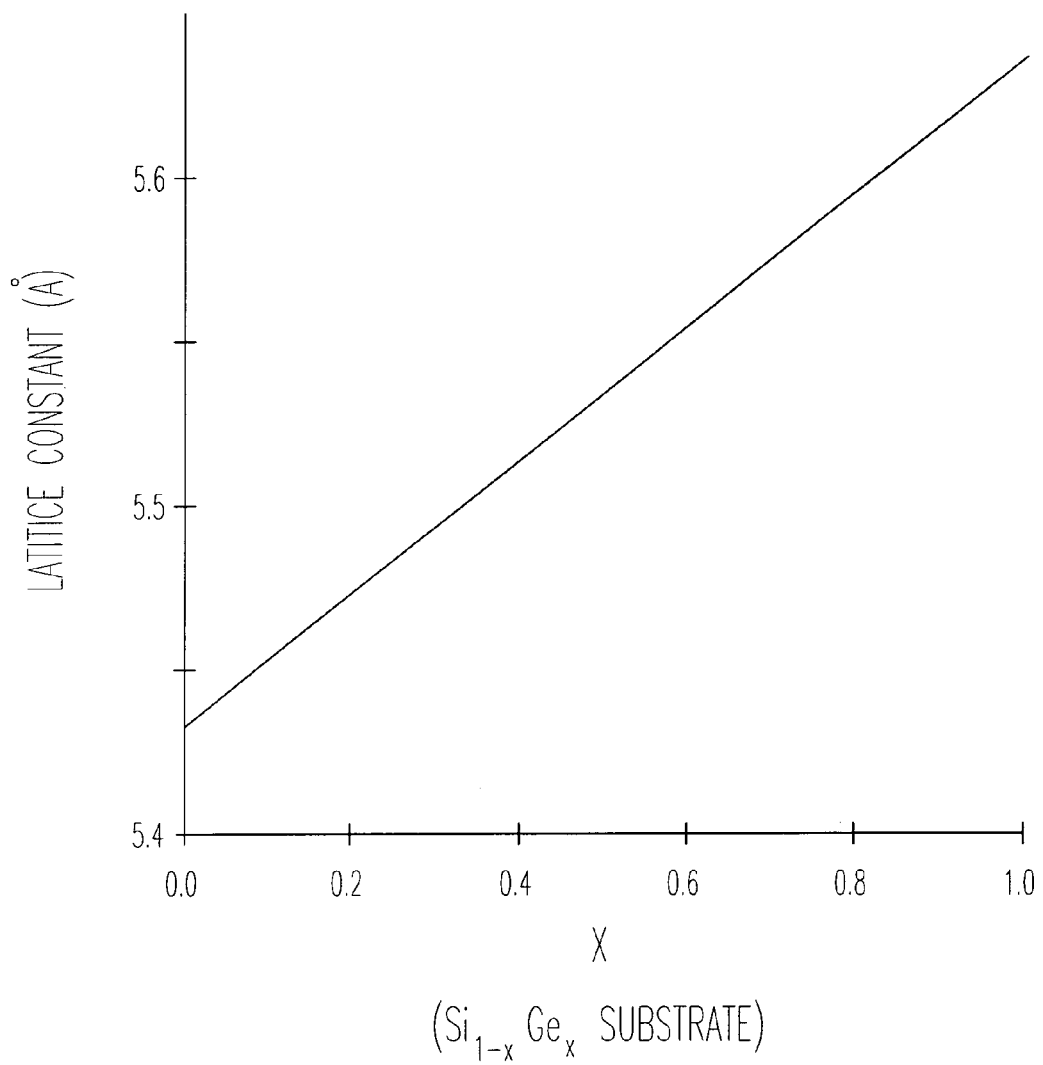
FIG. 1 illustrates the lattice constant of a $Si_{1-X}Ge_X$ substrate for different percentages (X) of Ge.
Figure 2:
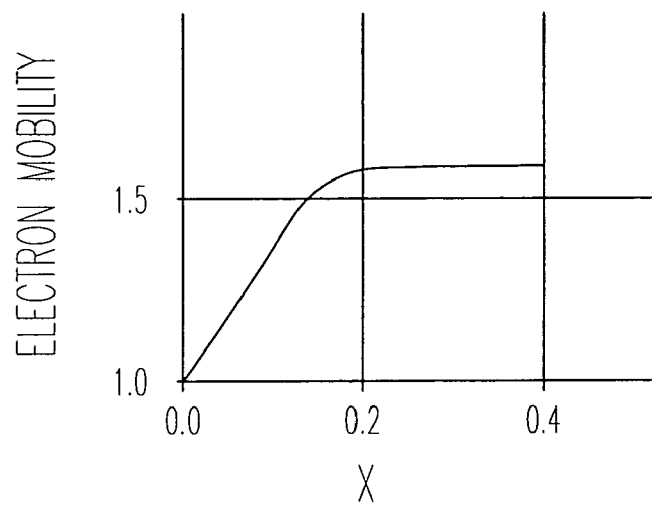
FIG. 2 illustrates the mobility enhancement for strained Si for different percentages (X) of Ge in a $Si_{1-X}Ge_X$ substrate.
Figure 3:
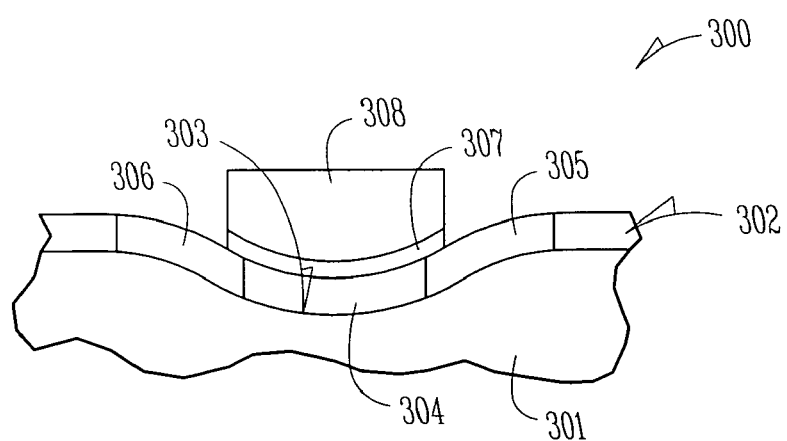
FIG. 3 illustrates a semiconductor device formed on a strained semiconductor film, according to various embodiments of the present subject matter.

FIG. 3 illustrates a semiconductor device formed on a strained semiconductor film, according to various embodiments of the present subject matter. The illustrated semiconductor device 300 includes a substrate 301 and a strained semiconductor film 302 bonded to the substrate. The illustrated substrate has a recessed surface 303. The semiconductor film is influenced by the naturally-occurring Van der Waal's force to conform to the shape of the recess. The Van der Waal's force bonds the semiconductor film 302 to the substrate 301.

In various embodiments, the semiconductor film 302 includes a single crystalline semiconductor material such a single crystalline silicon film. In various embodiments, the substrate 301 includes a silicon substrate. In various embodiments, the recess is formed in the substrate so as to cause the semiconductor film to undergo uniaxial strain when it is mechanically flexed into the recess and bonded to the substrate via the Van der Waal's force.

The illustrated semiconductor structure includes a transistor. In various embodiments, the strained semiconductor film includes an ultra thin body region 304 of a transistor that has a channel length less than or equal to about 100 nm and a thickness less or equal to about 30 nm. The transistor includes a first diffusion region 305 and a second diffusion region 306 (also referred to as source/drain regions). In various embodiments, the strained portion of the semiconductor film in the recess includes at least a portion of the first and second diffusion regions. According to various embodiments of the present subject matter, at least a portion of the first and second diffusion regions extend to non-strained portions of the semiconductor film. Furthermore, in various embodiments, at least a portion of the first and second diffusion region extend into the substrate. The illustrated transistor includes a gate insulator 307, such as an oxide and the like, formed above the body region 304 of the transistor and a gate 308 is formed on the gate insulator using relatively inexpensive semiconductor processes that are known to one of ordinary skill in the art.

Upon reading and comprehending this disclosure, one of ordinary skill in the art will understand the benefits associated with having a strained ultra-thin body region to form a channel region in the transistor. The continuous scaling of MOSFET technology to reduce channel lengths to sub-micron dimensions causes significant problems in conventional transistor structures. It is desired that the junction depth is much less than the channel length to minimize short channel effects such as drain induced barrier lowering, threshold voltage roll off, and sub-threshold conduction. In a Dynamic Random Access Memory (DRAM) application, for example, sub-threshold conduction is a significant problem as it reduces the charge storage retention time on capacitor nodes. When a MOSFET is scaled to have sub-micron channel lengths, the junction depths should be around a few hundred Å for channel lengths of about 1000 Å (100 nm). However, such shallow junctions are difficult to form by conventional implantation and diffusion techniques. One known method for suppressing short-channel effects uses extremely high levels of channel doping. However, these extremely high channel doping levels increase leakage and reduce carrier mobility such that the improved performance achieved by making the channel shorter is negated by lower carrier mobility. The strained silicon films of the present subject increase carrier mobility in the channel region, and thus can alleviate problems associated with the high channel doping.

FIGS. 4A–4E illustrates a process for forming a strained semiconductor film according to various embodiments of the present subject matter. The illustrated process involves a common LOCal Oxidation of Silicon (LOCOS) process and a solid phase epitaxy process, and takes advantage of the naturally-occurring Van der Wall's force to strain semiconductor film in a recess after removing oxide formed by the LOCOS process.

Figure 4A:
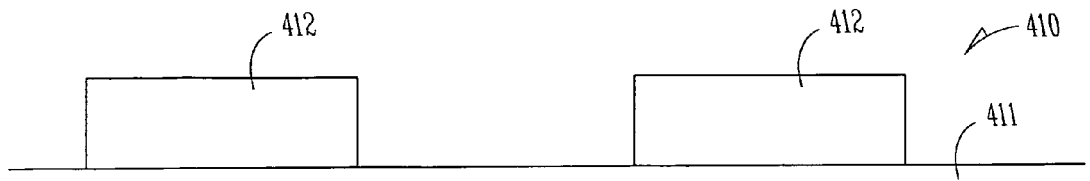
FIGS. 4A–4E illustrates a process for forming a strained semiconductor film according to various embodiments of the present subject matter that involves a common LOCal Oxidation of Silicon (LOCOS) process and a solid phase epitaxy process, and that takes advantage of the naturally-occurring Van der Wall's force to strain semiconductor film in a recess after removing the oxide formed by the LOCOS process.

FIG. 4A illustrates a semiconductor structure 410 toward the beginning of a LOCOS process. The semiconductor structure 410 includes a silicon substrate 411. A layer of silicon nitride 412 is deposited, such as by Chemical Vapor Deposition (CVD), on the silicon substrate and is etched to expose portions of the silicon substrate for subsequent selective oxidation. One of ordinary skill in the art will understand, upon reading and comprehending this disclosure, that the pattern of the silicon nitride affects the pattern and characteristics of the recesses and thus of the strained semiconductor film.

Figure 4B:
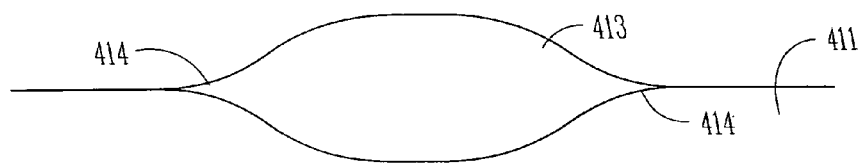

FIG. 4B illustrates the semiconductor structure 410 after the silicon substrate 411 has been oxidized and the silicon nitride mask 412 removed. In various embodiments, the oxide 413 is thermally grown by means of wet oxidation. The oxide grows where there is no masking nitride. At the edges of the nitride, some oxidant diffuses laterally to grow under the nitride edges. This lateral growth has the shape of a slowly tapering oxide wedge 414 and is commonly referred to as a "bird's beak."

Figure 4C:
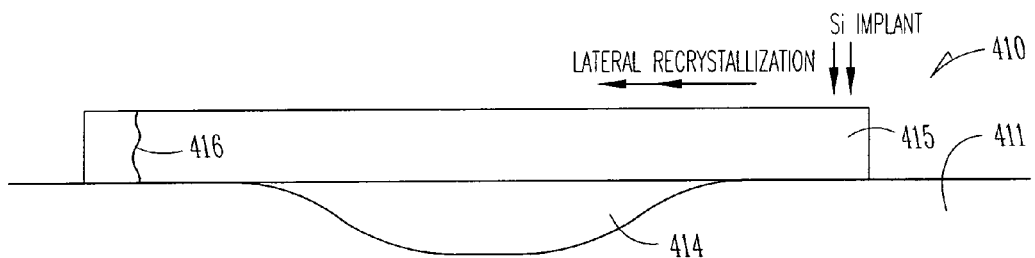

FIG. 4C illustrates the semiconductor structure 410 after the structure has been planarized to leave an oxide-filled recess 414 in the silicon substrate. A single crystalline semiconductor layer 415 is formed over the oxide-filled recess 414. This layer is subsequently micro-mechanically strained into a vacated recess in the process illustrated in FIG. 4D.

The single crystalline semiconductor layer in various embodiments of the present subject matter includes a single crystalline silicon layer. One method for forming the single crystalline silicon layer involves a solid phase epitaxial process. In various embodiments, the solid phase epitaxial process includes depositing a thin amorphous silicon layer and annealing the structure to recrystallize the amorphous silicon. One end of the amorphous layer is seeded to promote a desired crystalline growth. In various embodiments, for example, one end of the amorphous layer is implanted with silicon (illustrated by the vertical arrow and the "Si" reference). Upon annealing, the amorphous silicon laterally recrystallizes (illustrated by the horizontal arrow), thus providing an ultra-thin (less than or equal to about 300 Å thick) single crystalline layer of silicon 415 grown over the buried oxide 414. A grain boundary 416 is illustrated on the non-seeded end of the layer. In various embodiments, the deposited amorphous layer is lightly doped with desired channel impurities for a desired design of a transistor structure.

Figure 4D:
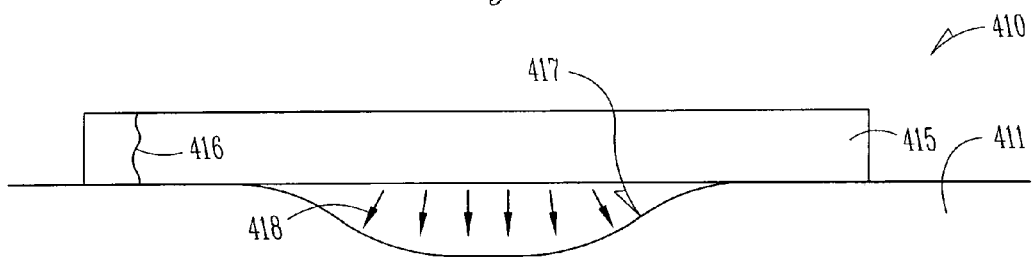
Figure 4E:
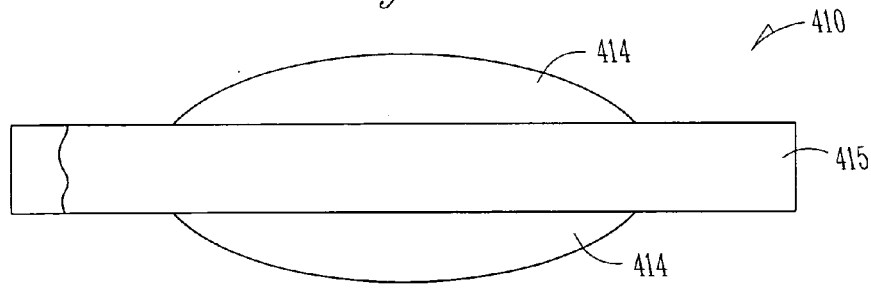

FIG. 4D illustrates the semiconductor structure 410 after the oxide is removed to form a recess 417 below the single crystalline silicon layer and to form a microscopic bridge across the recess. FIG. 4E illustrates the top view of FIG. 4D. The shape of the oxide-filled recess can vary according to the LOCOS process described earlier. The oxide is removed using a liquid oxide etch. The naturally occurring Van der Waal's force (illustrated using arrows 418 in FIG. 4D) collapses the bridge and bonds the single crystalline silicon layer to the silicon substrate within the recess. If the bridge does not collapse under the Van der Waal's force, a non-scale imprint mask can be used to press on the bridges to cause them to collapse allowing the Van der Waal's force to bond the single crystalline layer to the silicon substrate. Nano-scale imprint masks can be made with very small raised areas which either do or do not adhere to surface upon contact.

One of ordinary skill in the art will understand, upon reading and comprehending this disclosure, that the slowly tapering shape of the bird's beak is useful to controllably induce strain in ultra-thin semiconductor films. However, the tapered bird's beak shape is not required to practice the present subject matter. One of ordinary skill in the art will understand, upon reading and comprehending this disclosure, that other means for creating a recess or void in the substrate can be used. For example, a grinding process can be used to create a recess or a trench can be otherwise formed in the substrate. The resulting recess can be filled using a material that can be later etched away or otherwise removed after the single crystalline semiconductor layer is formed over the recess.

Figure 5A:
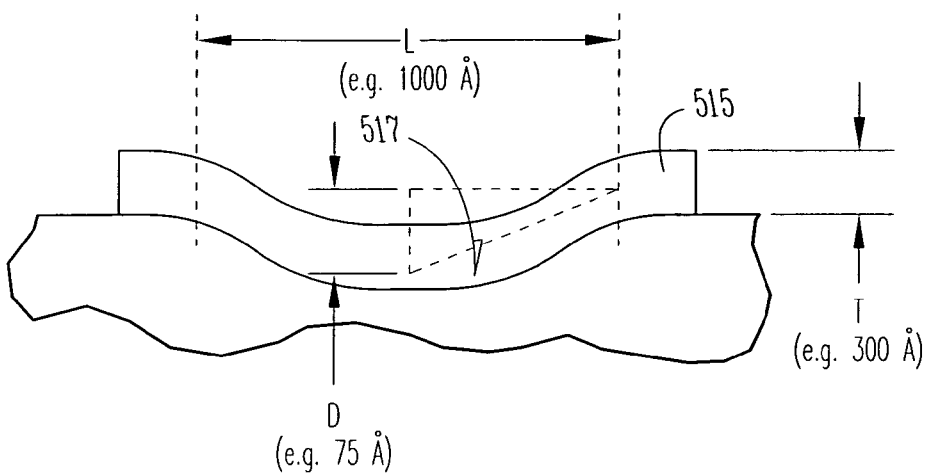
FIGS. 5A–5C illustrate the uniaxial strain in the semiconductor layer achieved by the process illustrated in FIGS. 4A–4E.
Figure 5B:
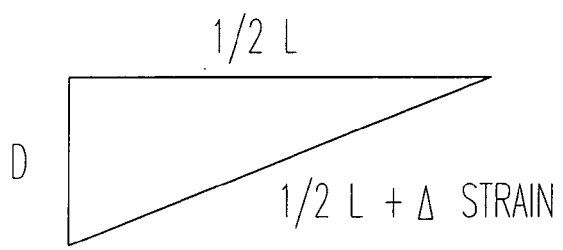
Figure 5C:
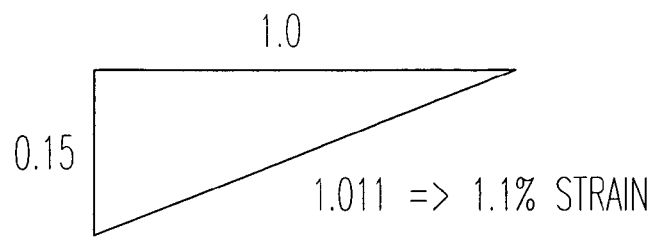

FIGS. 5A–5C illustrate the uniaxial strain in the semiconductor layer achieved by the process illustrated in FIGS. 4A–4E. Referring to FIG. 5A, the illustrated semiconductor layer 515 is collapsed and bonded to the substrate within the recess 517. In various embodiments, the illustrated semiconductor layer is an ultra-thin single crystalline silicon layer having a thickness (T) of 300 Å (30 nm) suitable for use to form a transistor channel less than or equal to about 1000 Å (100 nm). If the recess is formed with a depth (D) of about 75 Å (7.5 nm) and a length (L) of about 1000 Å (100 nm), the single crystalline silicon layer will undergo a micro-mechanical strain ($\Delta$ strain) attributable to the dimpling of the layer into the recess.

Referring to FIG. 5B, the dimpling process can be geometrically represented using a triangle with a first leg representing ½ L (half the length of the recess), and a second leg representing D (the depth of the recess). The hypotenuse of the triangle represents the strained layer (½ L+$\Delta$ strain). FIG. 5C illustrates the representation of FIG. 5B with simplified or normalized values. In FIG. 5C, 500 Å is normalized to 1.0, such that 75 Å is normalized to 0.15 (75 Å/500 Å). The normalized hypotenuse is calculated to be 1.011. Thus, in the example shown in FIG. 5A, the induced strain in the single crystalline silicon layer is about 1.1%. As stated earlier in the Background section with respect to Si/SiGe layers, it is desired to provide silicon with a biaxial strain around or greater than 0.5% and preferably a biaxial strain of 1% or greater to obtain the desired enhanced mobility associated with strained silicon. Thus, as shown by the example illustrated in FIGS. 5A–5C, the processes and structures of the present subject matter are capable of providing uniaxial strains in this range. As stated earlier in the Background section, uniaxial strain has advantages over biaxial strain as it reduces band gap and in-plane effective mass to improve conduction.

The present subject matter is capable of being used to create dimpled semiconductor layers such as ultra-thin silicon layers. The dimpled areas of the silicon layers provide a desired strain in the semiconductor. FIGS. 6A–B, 7A–B, 8 and 9 illustrate a process for creating a pattern of dimples in a semiconductor film to create locally strained film, according to various embodiments of the present subject mater. Semiconductor devices are capable of being fabricated to incorporate the strained film. For example, the dimpled or micro-mechanically strained film is capable of being incorporated in the channel region of MOSFETs.

Figure 6A:
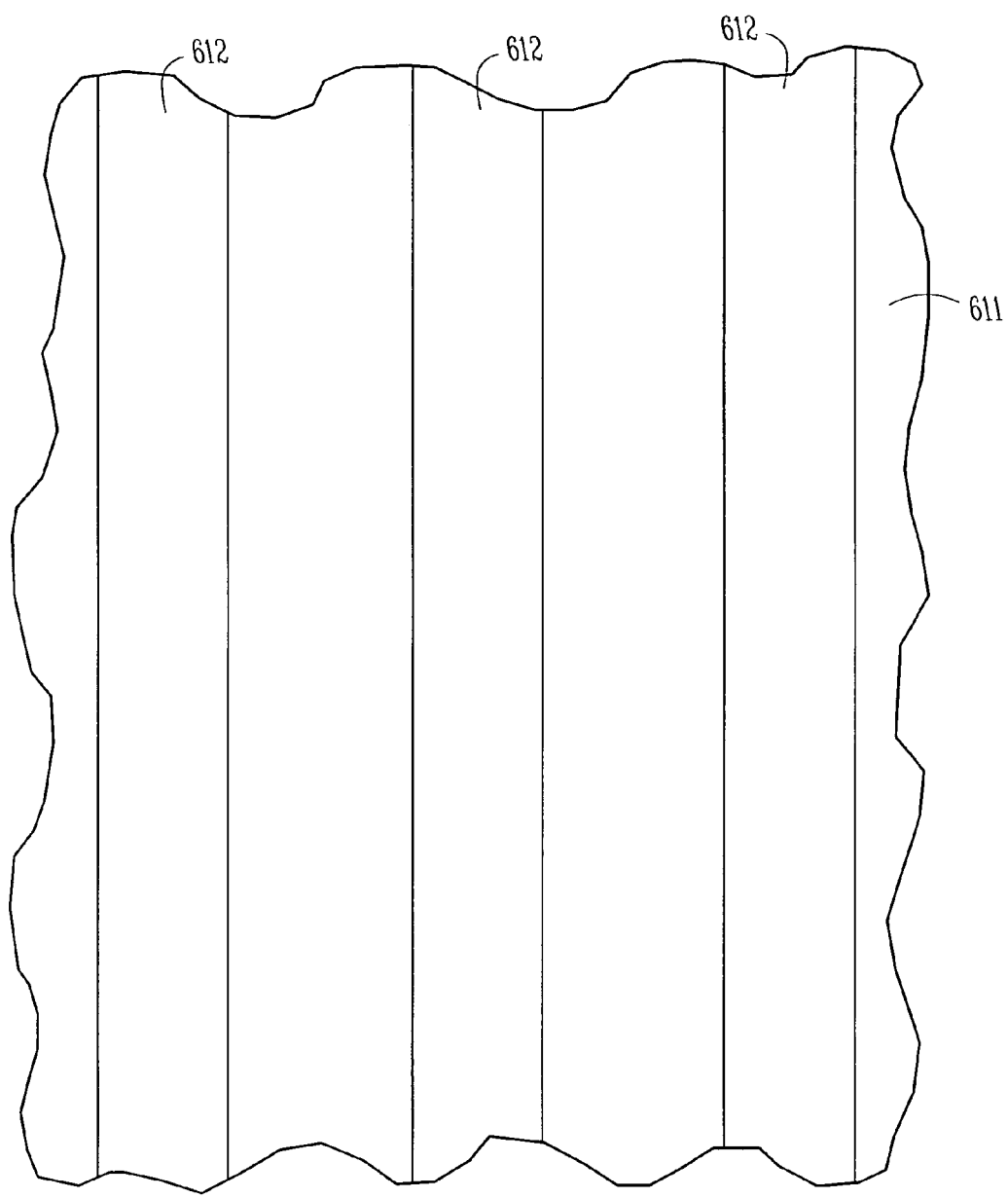
FIGS. 6A and 6B provide top and cross section views, respectfully, to illustrate a pattern of silicon nitride on a silicon substrate in preparation for performing a LOCOS process, according to various embodiments of the present subject matter.
Figure 6B:
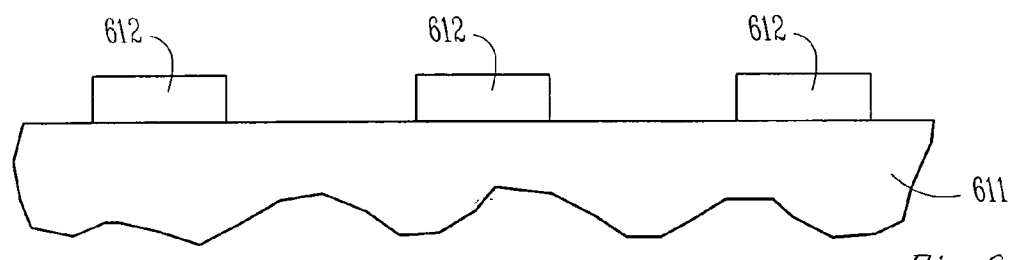

FIGS. 6A and 6B provide top and cross section views, respectfully, to illustrate a pattern of silicon nitride on a silicon substrate in preparation for performing a LOCOS process, according to various embodiments of the present subject matter. These views illustrate bars of silicon nitride 612 deposited on a silicon substrate 611. One of ordinary skill in the art will understand, upon reading and comprehending this disclosure, that the pattern of the silicon nitride corresponds to the pattern of the resulting recesses in the substrate, which in turn correspond to the pattern of strained film areas which are incorporated in semiconductor devices. The LOCOS process oxidizes the exposed portions of the substrate. The silicon nitride is removed and the substrate is planarized.

Figure 7A:
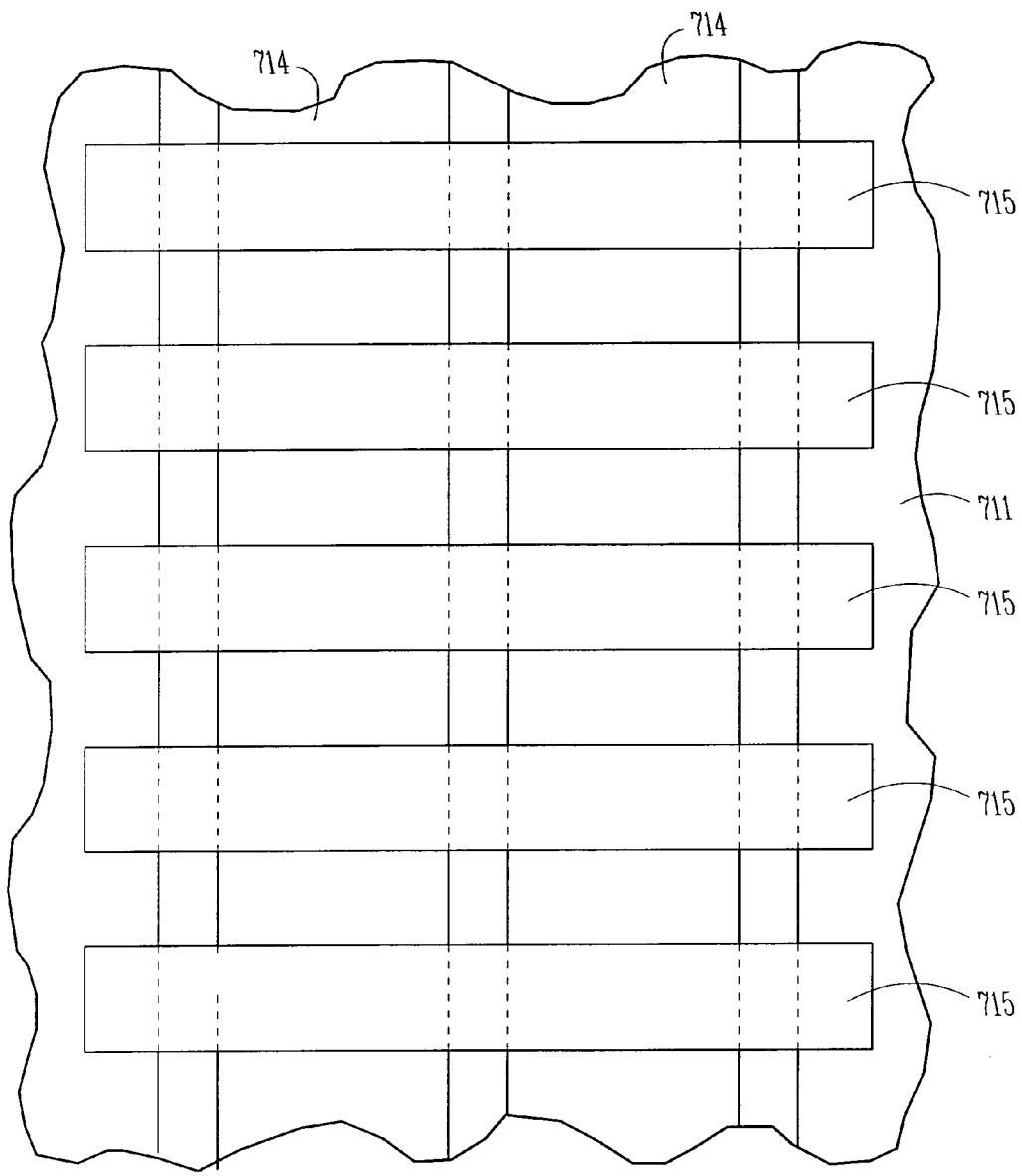
FIGS. 7A and 7B provide top and cross section views, respectfully, to illustrate a resulting structure after the oxidized structure is planarized, and the single crystalline film is formed over the oxide-filled recesses using a solid phase epitaxial process, according to various embodiments of the present subject matter.
Figure 7B:
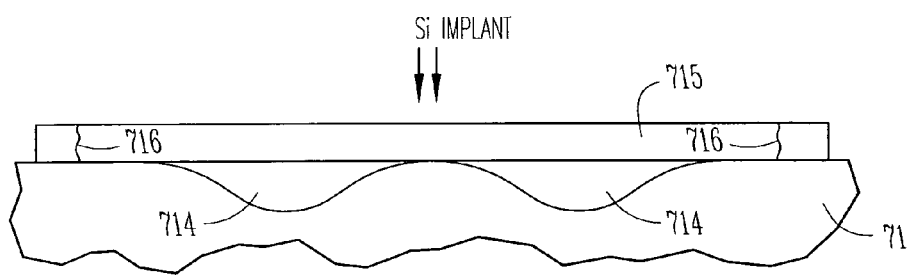

FIGS. 7A and 7B provide top and cross section views, respectfully, to illustrate a resulting structure after the oxidized structure is planarized, according to various embodiments of the present subject matter. The single crystalline film 715 is formed over the substrate 711, including over the oxide-filled recesses 714.

In various embodiments, a solid phase epitaxial process is performed to form single crystalline silicon films on the substrate. In one solid phase epitaxial process, an amorphous silicon film is deposited on the substrate and patterned to form rows as illustrated in FIG. 7A. The amorphous silicon film is crystallized or recrystallized. In FIG. 7B, for example, silicon is implanted into the amorphous film to seed the recrystallization process. The semiconductor structure is annealed such that the amorphous silicon undergoes a lateral recrystallization process to form single crystalline silicon film. Grain boundaries are illustrated on each end of the single crystalline silicon film. In the illustrated embodiment, after the single crystalline silicon film is formed, the oxide is removed from the recesses using a liquid oxide etch.

Figure 8:
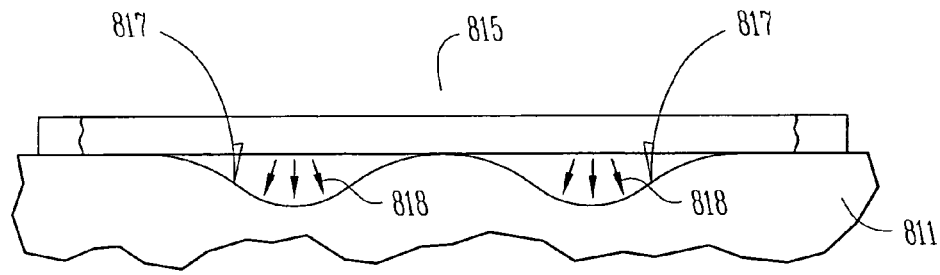
FIG. 8 provides a cross section view illustrating the single crystalline film being influenced into the recesses after the oxide is removed from beneath the film, according to various embodiments of the present subject matter.

FIG. 8 provides a cross section view illustrating the single crystalline film 815 being influenced into the recesses 817 after the oxide is removed from beneath the film, according to various embodiments of the present subject matter. After the oxide is removed, the naturally-occurring Van der Waal's force (illustrated in the figure as arrows 818) acts to influence the single crystalline silicon film into the recesses, and bond the film to the substrate. A nano-imprint mask can be used to assist with collapsing the silicon film bridges if the Van der Waal's force does not collapse the bridge. Thus, a micro-mechanical force dimples the single crystalline film to induce localized strain in the film.

Figure 9:
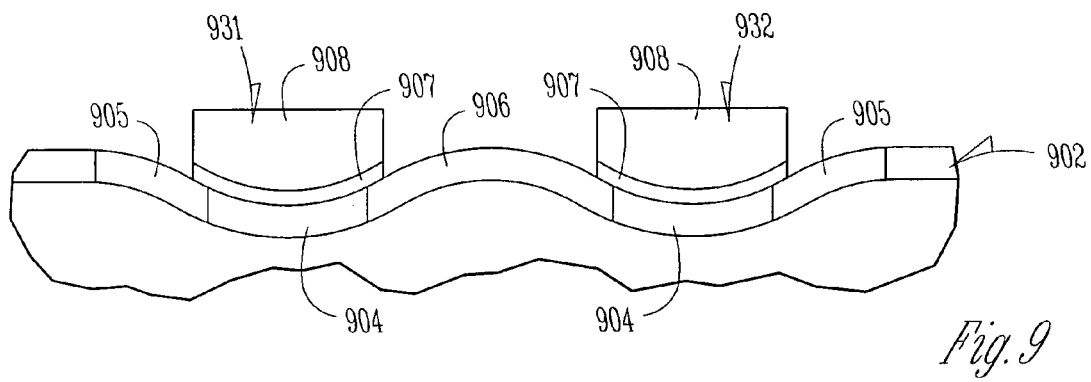
FIG. 9 provides a cross section view of two transistor devices in an array of transistor devices in which the transistor devices are formed using strained semiconductor films, according to various embodiments of the present subject matter.

FIG. 9 provides a cross section view of two transistor devices in an array of transistor devices in which the transistor devices are formed using strained semiconductor films, according to various embodiments of the present subject matter. Each transistor 931 and 932 includes an ultra-thin body 904 formed with strained semiconductor film 902. In various embodiments, the channel length of the transistor is less than or equal to about 1000 Å, and the thickness of the film is less than or equal to about 300 Å. The strain enhances mobility in the channel, thus overcoming problems associated with heavy channel doping.

One of ordinary skill in the art will understand, upon reading and comprehending this disclosure, that the transistors can be fabricated in the micro-mechanical strained ultra-thin silicon body layer using conventional techniques. Each transistor includes a gate insulator 907, such as a gate oxide and the like, deposited over the channel region, and a gate 908 deposited over the gate insulator. Each transistor includes a first diffusion region 905 and a second diffusion region 906. In the illustrated embodiment, the transistors share second diffusion regions 906. Other layouts are encompassed by the present subject matter. One of ordinary skill in the art will also understand, upon reading and comprehending this disclosure, how to fabricate the appropriate wiring level(s) for these transistors.

The diffusion regions can be formed using a number of processes. In various embodiments, for example, the substrate includes appropriately doped regions beneath the desired diffusion regions in the semiconductor film. These diffusion regions in the substrate may be positioned where the amorphous region contacts the substrate in FIG. 7B. When the amorphous silicon film is annealed during the solid phase epitaxy process, impurities diffuse from the substrate into the desired regions in the single crystalline film.

Figure 10:
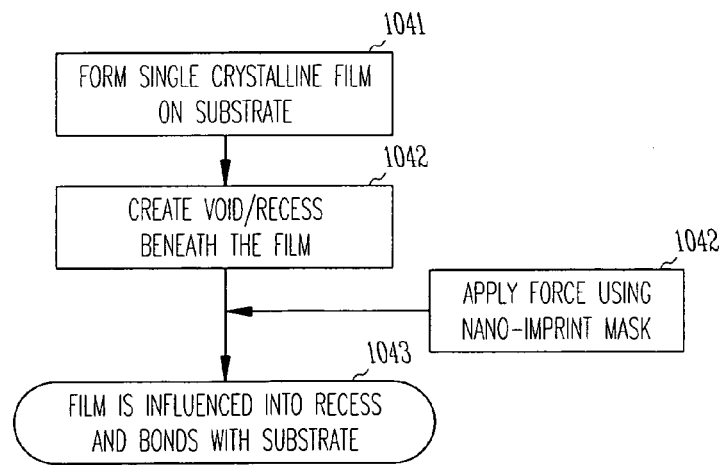
FIG. 10 illustrates a method for forming a strained semiconductor film according to various embodiments of the present subject matter.

FIG. 10 illustrates a method for forming a strained semiconductor film according to various embodiments of the present subject matter. In the illustrated method, a single crystalline semiconductor film is formed on a substrate at 1041. At 1042, a void or recess is created beneath the film. Thus, the film forms a bridge that spans across the recess. As described above, various embodiments of the present subject matter use a LOCOS process to create the recess. One benefit of the LOCOS process is that it is a common economical semiconductor fabrication process. Another benefit of the LOCOS process is the tapered bird's beak, which allows for controlled strain in the film. At 1043, the film is influenced into the recess and bonds with the substrate using the naturally-occurring Van der Waal's force. If the characteristics of the film and the recess are such that the Van der Waal's force is not sufficient to collapse the bridge into the recess, a force is applied using a nano-imprint mask at 1044.

Figure 11:
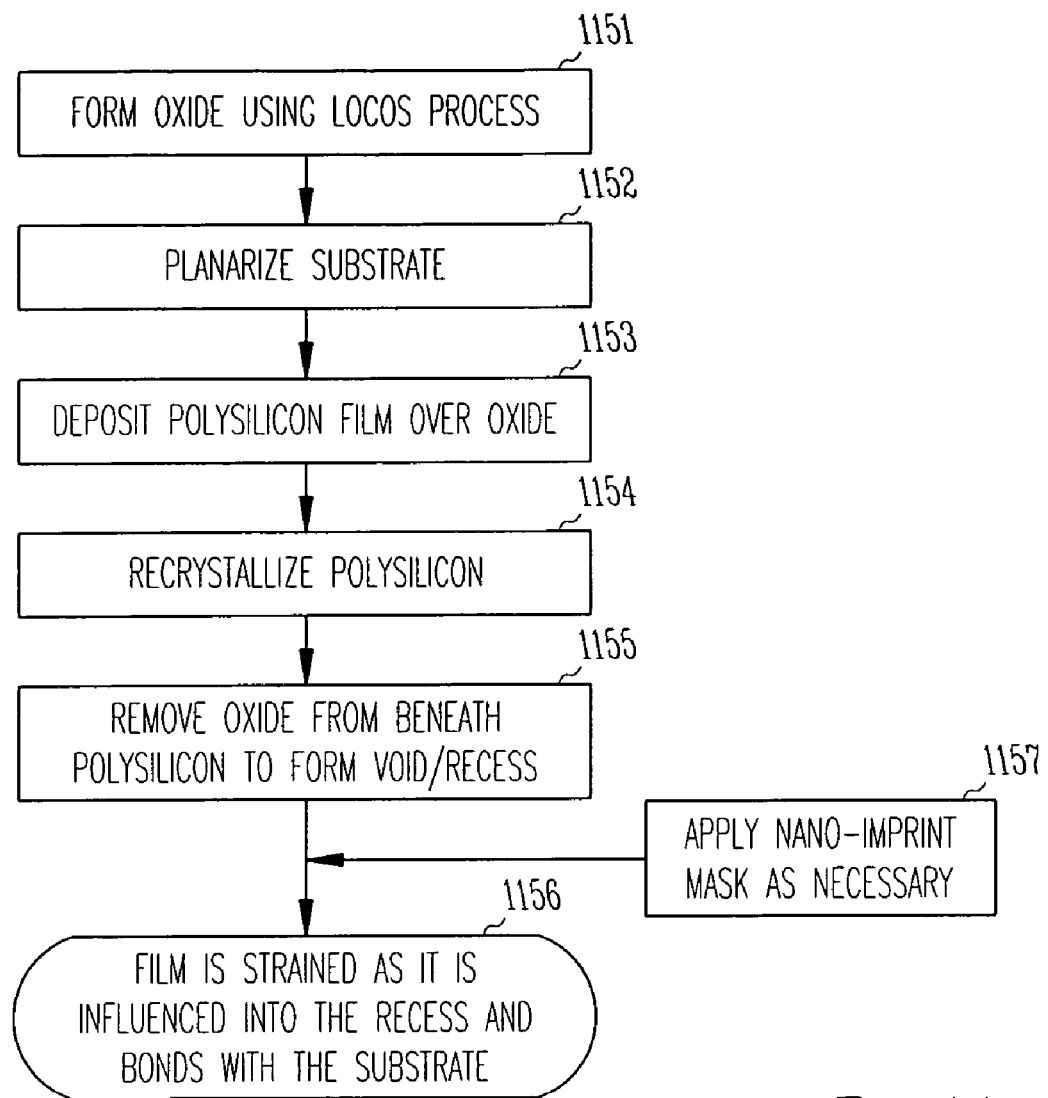
FIG. 11 illustrates a method for forming a strained semiconductor film according to various embodiments of the present subject matter.

FIG. 11 illustrates a method for forming a strained semiconductor film according to various embodiments of the present subject matter. In the illustrated method, an oxide is formed in a silicon substrate using a LOCOS process at 1151. The substrate is planarized at 1152 to form an even surface. The resulting structure includes oxide-filled recesses. At 1153, amorphous silicon film is deposited over the oxide. At 1154, the amorphous silicon film is recrystallized using a solid phase epitaxy process, which involves seeding the amorphous film (such as with silicon implants) and annealing the structure to laterally recrystallize the film into a single crystalline silicon film. At 1155, the oxide is removed from beneath the film to form a void(s) or recess (es) beneath the single crystalline silicon film which forms a bridge that spans across the recess. At 1156, the film is strained as it is influenced into the recess and bonds with the substrate using the naturally-occurring Van der Waal's force. If the characteristics of the film and the recess are such that the Van der Waal's force is not sufficient to collapse the bridge into the recess, a force is applied using a nano-imprint mask at 1157.

Figure 12:
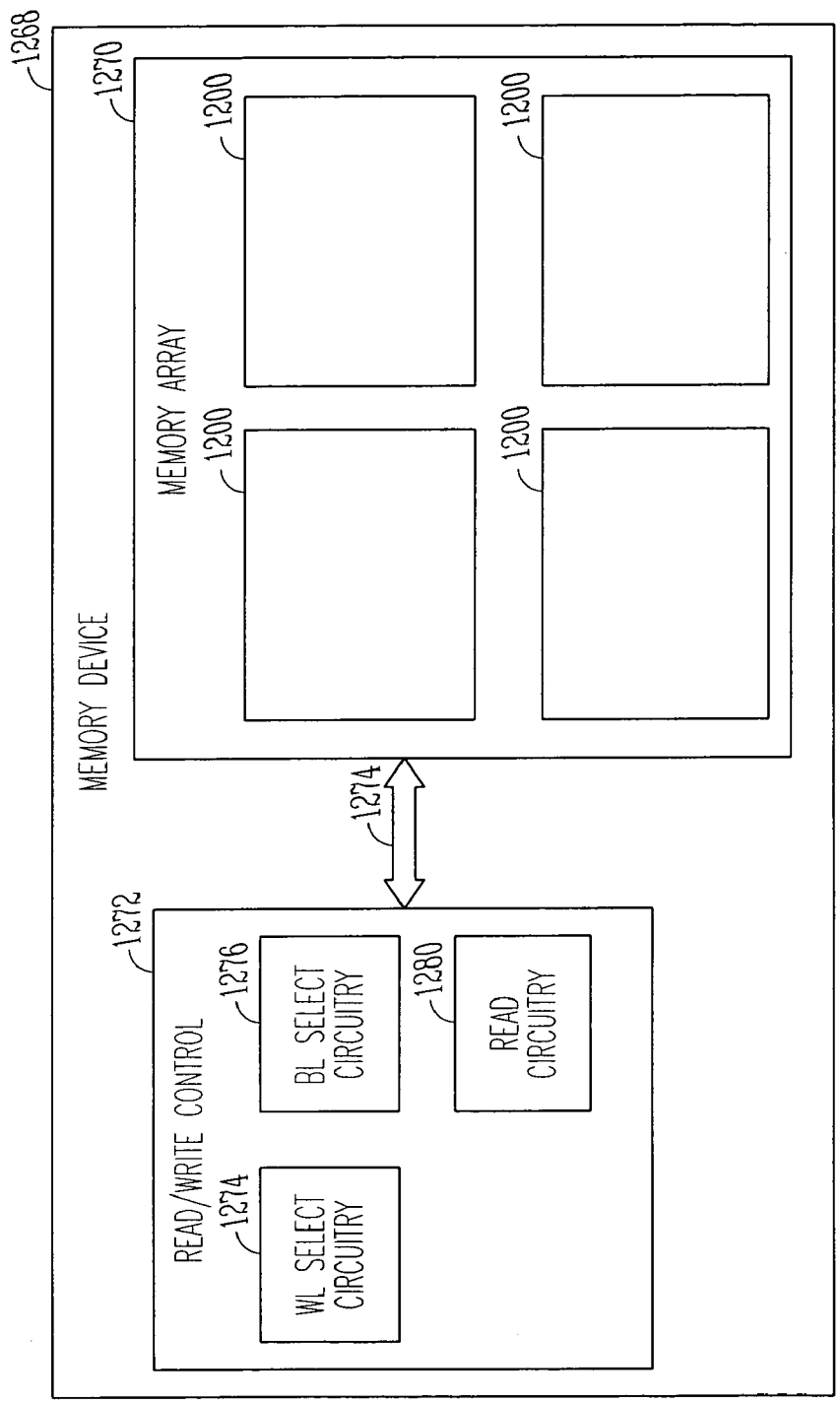
FIG. 12 is a simplified block diagram of a high-level organization of various embodiments of a memory device according to various embodiments of the present subject matter.

FIG. 12 is a simplified block diagram of a high-level organization of various embodiments of a memory device according to various embodiments of the present subject matter. The illustrated memory device 1268 includes a memory array 1270 and read/write control circuitry 1272 to perform operations on the memory array via communication line(s) 1274. The illustrated memory device 1268 may be a memory card or a memory module such as a single inline memory module (SIMM) and dual inline memory module (DIMM). One of ordinary skill in the art will understand, upon reading and comprehending this disclosure, that semiconductor components in the memory device 1268 and/or the control circuitry 1272 are able to be fabricated using the strained semiconductor films, as described above. For example, in various embodiments, the memory device 1268 and/or the control circuitry 1272 include transistors with strained, ultra-thin body layers. The structure and fabrication methods for these strained, ultra-thin body layers have been described above.

The memory array 1270 includes a number of memory cells 1200. The memory cells in the array are arranged in rows and columns. In various embodiments, word lines connect the memory cells in the rows, and bit lines connect the memory cells in the columns. The read/write control circuitry 1272 includes word line select circuitry 1274, which functions to select a desired row. The read/write control circuitry 1272 further includes bit line select circuitry 1276, which functions to select a desired column. The read/write control circuitry 1272 further includes read circuitry 1280, which functions to detect a memory state for a selected memory cell in the memory array 1270.

Figure 13:
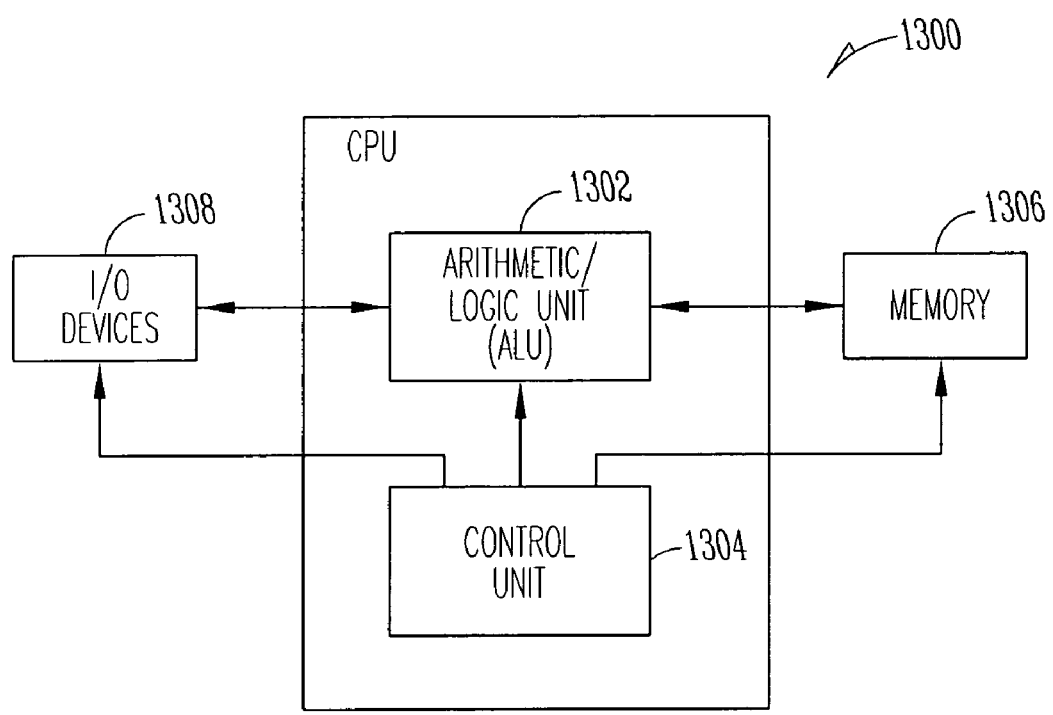
FIG. 13 is a simplified block diagram of a high-level organization of various embodiments of an electronic system according to the present subject matter.

FIG. 13 is a simplified block diagram of a high-level organization of various embodiments of an electronic system according to the present subject matter. In various embodiments, the system 1300 is a computer system, a process control system or other system that employs a processor and associated memory. The electronic system 1300 has functional elements, including a processor or arithmetic/logic unit (ALU) 1302, a control unit 1304, a memory device unit 1306 (such as illustrated in FIG. 12) and an input/output (I/O) device 1308. Generally such an electronic system 1300 will have a native set of instructions that specify operations to be performed on data by the processor 1302 and other interactions between the processor 1302, the memory device unit 1306 and the I/O devices 1308. The control unit 1304 coordinates all operations of the processor 1302, the memory device 1306 and the I/O devices 1308 by continuously cycling through a set of operations that cause instructions to be fetched from the memory device 1306 and executed. According to various embodiments, the memory device 1306 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include strained semiconductor films in accordance with the present subject matter.

The illustration of the system 1300 is intended to provide a general understanding of one application for the structure and circuitry of the present subject matter, and is not intended to serve as a complete description of all the elements and features of an electronic system using strained semiconductor films according to the present subject matter. As one of ordinary skill in the art will understand, such an electronic system can be fabricated in single-package processing units, or even on a single semiconductor chip, in order to reduce the communication time between the processor and the memory device.

Applications containing strained semiconductor films, such as transistors with a strained ultra-thin semiconductor body layer, as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

Uniaxially strained semiconductor films are adapted to be fabricated using common and economical semiconductor processing techniques. Semiconductor layers are dimpled using a micro-mechanical technique to provide strained semiconductor material. The micro-mechanical technique uses the strong Van der Waal's force that naturally bond surfaces together to dimple and bond the strained semiconductor layer to recesses in a substrate. In various embodiments, an imprint mask is used to assist the Van der Waal's force to dimple the semiconductor layers. The strained semiconductor material enhances electron mobility, and is also capable of enhancing hole mobility.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A semiconductor structure, comprising:
   a substrate with a top surface and a recess in the top surface; and
   a crystalline layer bonded to the substrate, the crystalline layer having a thickness sufficiently thin to be bonded to the recess of the substrate and induce a strain in the crystalline layer.

2. The structure of claim 1, wherein the strain in the crystalline layer is at least 0.5%.

3. The structure of claim 1, wherein the strain in the crystalline layer is at least 1%.

4. A structure, comprising:
   a substrate with a top surface and a recess in the top surface; and
   a crystalline layer bonded to the substrate including to the recess in the top surface, the crystalline layer having a thickness no more than approximately 300 Å, and further having a local strain of at least 0.5% induced by a bond between the crystalline layer and the recess.

5. The structure of claim 4, wherein the strain in the crystalline layer is at least 1%.

6. The structure of claim 4, wherein the strain is uniaxial.

7. A structure, comprising:
   a substrate with a top surface and a recess in the top surface, the recess having a horizontal dimension in a first direction approximately equal to 1000 Å; and
   a crystalline layer bonded to the substrate including to the recess in the top surface, the crystalline layer having a thickness of approximately 300 Å, and further having a local strain where the crystalline layer is bonded to the recess.

8. The structure of claim 7, wherein the strain in the crystalline layer is at least 0.5%.

9. The structure of claim 7, wherein the strain in the crystalline layer is at least 1%.

10. A structure, comprising:
    a substrate with a top surface and a recess in the top surface, the recess having a predetermined contour; and
    a crystalline layer having a thickness less than approximately 300 Å bonded to the substrate, the crystalline layer being conformed to the predetermined contour of the recess to induce a local uniaxial strain.

11. The structure of claim 10, wherein the predetermined contour is created by performing a local oxidation of silicon (LOCOS) process and removing oxide resulting from the LOCOS process.

12. The structure of claim 10, wherein a horizontal dimension in a first direction of the LOCOS process is approximately 1000 Å.

13. A semiconductor structure, comprising:
    a substrate having a number of recesses; and
    a single crystalline semiconductor film bonded to the substrate within the number of recesses via a Van der Waal's force to form a semiconductor film with a number of dimples corresponding to the number of recesses, wherein the semiconductor film in the number of dimples is strained.

14. The structure of claim 13, wherein the semiconductor film has a depth less than 30 nm.

15. The structure of claim 13, further comprising a transistor formed at each of the number of dimples, wherein the transistor includes a body region formed by at least a portion of the strained semiconductor film in the dimple.

16. The structure of claim 15, wherein the body region of each transistor is an ultra-thin body region.

17. The structure of claim 15, wherein the body region of each transistor has a length less than 100 nm and a depth less than 30 nm.

18. A silicon structure, comprising:
a silicon substrate formed with a number of recesses;
a single crystalline silicon film bonded to the substrate within the number of recesses due to a Van der Waal's force to micro-mechanically strain the silicon film; and
a gate formed over the silicon film over at least a portion of each of the number of recesses, the gate being separated from the silicon film by a gate insulator,
wherein the silicon film formed over at least a portion of each of the number of recesses includes a strained ultra-thin body region.

19. The structure of claim 18, wherein the ultra-thin body region is under a strain of at least 0.5%.

20. The structure of claim 18, wherein the ultra-thin body region is under a strain of about 1%.

21. A semiconductor structure, comprising:
a semiconductor membrane with local strained areas, formed by a process including:
performing a local oxidation of silicon (LOCOS) process in a substrate and removing resulting oxide to form a recess in the substrate; and
bonding a semiconductor membrane to the substrate to induce a strain where the membrane conforms to the recess in the substrate,
wherein the recess has a horizontal dimension in a first direction of approximately 1000 Å and a vertical depth of approximately 75 Å.

22. A transistor, comprising:
a single crystalline body region positioned between a first source/drain region and a second source/drain region, the single crystalline body region being bonded to a recess in a substrate to induce a strain in the single crystalline body region;
a gate insulator formed over the body region; and
a gate formed over the gate insulator.

23. The transistor of claim 22, wherein the single crystalline body region includes silicon.

24. The transistor of claim 22, wherein the single crystalline body region is under a strain of at least 0.5%.

25. The transistor of claim 22, wherein the single crystalline body region is under a strain of about 1%.

26. The transistor of claim 22, wherein the single crystalline body region includes an ultra-thin body region.

27. The transistor of claim 22, wherein the single crystalline body region includes a body region having a length equal to 100 nm or less and a depth 30 nm or less.

28. A transistor, comprising:
a single crystalline layer bonded to a substrate to locally strain the single crystalline layer where the single crystalline layer conforms to a recess in the substrate, the single crystalline layer including a body region, a first source/drain region and a second source/drain region, the body region being positioned where the single crystalline layer is locally strained between the first source/drain region and the second source/drain region;
a gate insulator formed over the body region; and
a gate formed over the gate insulator.

29. The transistor of claim 28, wherein the single crystalline layer has a thickness of approximately 300 Å, and the length of the body region is approximately 1000 Å.

30. The transistor of claim 28, wherein the single crystalline layer has a thickness less than approximately 300 Å.

31. The transistor of claim 28, wherein the strain in the single crystalline layer is at least 0.5%.

32. The transistor of claim 28, wherein the strain in the single crystalline layer is approximately 1%.

33. The transistor of claim 28, wherein the strain in the single crystalline layer is uniaxial.

34. A transistor, comprising:
a single crystalline layer bonded to a substrate with a recess, where the recess is formed by performing a local oxidation of silicon process to form a local area of silicon oxide and then removing the silicon oxide, wherein a local strain is induced where the single crystalline layer conforms to the substrate;
the single crystalline layer including a body region, a first source/drain region and a second source/drain region, the body region being positioned in the local strain of the single crystalline layer between the first source/drain region and the second source/drain region;
a gate insulator formed over the body region; and
a gate formed over the gate insulator.

35. The transistor of claim 34, wherein the recess is approximately 1000 Å long and has a depth of approximately 300 Å.

36. The transistor of claim 34, wherein the strain in the single crystalline layer is at least 0.5%.

37. The transistor of claim 34, wherein the strain in the single crystalline layer is approximately 1%.

38. The transistor of claim 34, wherein the strain in the single crystaline layer is uniaxial.

* * * * *

UNITED STATES PATENT AND TRADEMARK OFFICE
CERTIFICATE OF CORRECTION

PATENT NO. : 7,202,530 B2
APPLICATION NO. : 11/210927
DATED : April 10, 2007
INVENTOR(S) : Forbes It is certified that error appears in the above-identified patent and that said Letters Patent is hereby corrected as shown below:

Title Page

On page 2, in field (56), under "Other Publications", in column 2, line 1, delete "Wager" and insert -- Wafer --, therefor.

On page 2, in field (56), under "Other Publications", in column 2, line 46, delete "SiO2" and insert -- $SiO_2$ --, therefor.

On page 3, in field (56), under "Other Publications", in column 1, line 21, delete "compiant" and insert -- compliant --, therefor.

On page 3, in field (56), under "Other Publications", in column 1, line 22, delete "Inium" and insert -- Indium --, therefor.

On page 3, in field (56), under "Other Publications", in column 2, line 4, delete "Si]-xGex" and insert -- $Si_{1-x}Ge_x$ --, therefor.

On page 3, in field (56), under "Other Publications", in column 2, line 8, delete "GexSi1-x" and insert -- $Ge_xSi_{1-x}$ --, therefor.

On page 3, in field (56), under "Other Publications", in column 2, line 24, delete "Digest" and insert -- Device --, therefor.

On page 3, in field (56), under "Other Publications", in column 2, line 39, delete "Si1-xGex" and insert -- $Si_{1-x}Ge_x$ --, therefor.

On page 3, in field (56), under "Other Publications", in column 2, line 40, delete "complaint" and insert -- compliant --, therefor.

On page 3, in field (56), under "Other Publications", in column 2, line 41, delete "Electron" and insert -- Electronic --, therefor.

On page 3, in field (56), under "Other Publications", in column 2, line 47, after "optoelectronic" insert -- devices --.

On page 3, in field (56), under "Other Publications", in column 2, line 49, delete "Devie" and insert -- Device --, therefor.

In column 4, line 11, delete "Van der Wall's" and insert -- Van der Waal's --, therefor.

UNITED STATES PATENT AND TRADEMARK OFFICE
CERTIFICATE OF CORRECTION

PATENT NO. : 7,202,530 B2
APPLICATION NO. : 11/210927
DATED : April 10, 2007
INVENTOR(S) : Forbes It is certified that error appears in the above-identified patent and that said Letters Patent is hereby corrected as shown below:

In column 5, line 48, after "such" delete "a" and insert -- as --, therefor.

In column 6, line 40, delete "Van der Wall's" and insert -- Van der Waal's --, therefor.

In column 14, line 46, in Claim 38, delete "crystaline" and insert -- crystalline --, therefor.

Signed and Sealed this

Fifth Day of June, 2007

JON W. DUDAS
*Director of the United States Patent and Trademark Office*